(12) United States Patent
Menon et al.

(10) Patent No.: US 7,667,819 B2
(45) Date of Patent: Feb. 23, 2010

(54) SYSTEM AND METHOD FOR CONTRAST ENHANCED ZONE PLATE ARRAY LITHOGRAPHY

(75) Inventors: Rajesh Menon, Cambridge, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 733 days.

(21) Appl. No.: 11/154,352

(22) Filed: Jun. 16, 2005

(65) Prior Publication Data
US 2006/0183058 A1    Aug. 17, 2006

Related U.S. Application Data

(60) Provisional application No. 60/653,766, filed on Feb. 17, 2005.

(51) Int. Cl.
*G03B 27/34* (2006.01)
(52) U.S. Cl. ............... 355/18; 430/322; 430/396
(58) Field of Classification Search ............ None
See application file for complete search history.

(56) References Cited

U.S. PATENT DOCUMENTS

| | | | |
|---|---|---|---|
| 4,663,275 A | 5/1987 | West et al. | |
| 5,554,489 A | 9/1996 | Ishibashi et al. | |
| 5,900,637 A | 5/1999 | Smith | |
| 6,259,104 B1 | 7/2001 | Baer | |
| 6,485,891 B1 * | 11/2002 | Noguchi et al. | 430/311 |
| 6,894,292 B2 | 5/2005 | Gil et al. | |
| 2004/0043328 A1 | 3/2004 | Lu | |
| 2004/0069957 A1 | 4/2004 | Menon et al. | |
| 2004/0124372 A1 * | 7/2004 | Gil et al. | 250/492.2 |
| 2004/0152011 A1 | 8/2004 | Chen et al. | |
| 2004/0201832 A1 * | 10/2004 | Shirota | 355/67 |
| 2005/0064347 A1 * | 3/2005 | Wang | 430/322 |

FOREIGN PATENT DOCUMENTS

| | | |
|---|---|---|
| EP | 0293376 | 12/1988 |
| JP | 07248604 | 9/1995 |

OTHER PUBLICATIONS

B.F. Griffing et al., "Contrast Enhanced Photolithography," IEEE Electron Device Letters, vol. EDL-4, No. 1, Jan. 1983, pp. 14-16.

B.F. Griffing et al., "Contrast Enhanced Photoresists- Processing and Modeling," Polymer Engineering and Science, Mid-Dec. 1983, vol. 23, No. 17, pp. 947-952.

H.I. Smith, "A proposal for maskless, zone-plate-array nanolithography," J. Vac. Sci. Technol. B 14(6), Nov./Dec. 1996, pp. 4318-4322.

I.J. Djomehri et al., "Zone-plate-array lithography in the deep ultraviolet," J. Vac. Sci. Technol. B 16(6), Nov./Dec. 1998, pp. 3426-3429.

J.C. Crano (ed.), *Organic Photochromic and Thermochromic Compounds*, Plenum Publishers, NY, 1999, pp. 2-4.

D.J.D. Carter, "Maskless, parallel patterning with zone-plate array lithography," J. Vac. Sci. Technol. B 17(6), Nov./Dec. 1999, pp. 3449-3452.

R. Menon et al., "Zone-Plate-Array Lithography (ZPAL): Simulations for System Design," X-Ray Microscopy, Proceedings of the Sixth International Conference, Berkeley, C.A., Aug. 2-6, 1999, American Institute of Physics, 2000.

D. Gil et al., "Lithographic Patterning and Confocal Imaging with Zone Plates," J. Vac. Sci. Technol. B 18(6), Nov./Dec. 2000, pp. 2881-2885.

S. Caron et al., "Photodarkening and partial photobleaching: application to dichromated gelatin," Applied Optics, Feb. 10, 2001, vol. 40, No. 5, pp. 707-713.

S. Caron et al., "Photobleaching of a solid photchromc medium by a Gaussian laser beam," Applied Optics, May 20, 2002, vol. 41, No. 15, pp. 2907-2913.

D. Gil, "Parallel maskless optical lithography for prototyping, low-volume production, and research," J. Vac. Sci. Technol. B 20(6), Nov./Dec. 2002, pp. 2597-2601.

R. Menon et al., "Zone-Plate Array Lithography (ZPAL): A Maskless fast-turn-around system for Microoptic Device Fabrication," Proceedings of Micromachining and Microfabrication, San Jose, CA, Jan. 25-31, 2003, SPIE vol. 4984.

D. Gil et al., "The Case for Diffractive Optics in Maskless Lithography," J. Vac. Sci. Technol. B. 21(6), Nov./Dec. 2003, pp. 2810-2814.

D. Gil et al., "Fabrication of high-numerical-aperture phase zone plates with a single lithography exposure and no etching," J. Vac. Sci. Technol. B. 21(6), Nov./Dec. 2003, pp. 2956-2960.

D. Gil et al., "The Promise of Diffractive Optics in Maskless Lithography," Microelectronic Enginneering, vol. 73-74, 2004, pp. 35-41.

(Continued)

*Primary Examiner*—Daborah Chacko Davis
(74) *Attorney, Agent, or Firm*—Gauthier & Connors LLP

(57) ABSTRACT

A lithography system is disclosed that includes an array of focusing elements for directing focused illumination toward a recording medium, and a reversible contrast-enhancement material disposed between the recording medium and the array of focusing elements.

14 Claims, 11 Drawing Sheets

OTHER PUBLICATIONS

R. Menon et al., "An Alpha Prototype System for Zone-Plate-Array Lithography," J. Vac. Sci. Technol. B., 22 (16), Nov./Dec. 2004, pp. 3032-3037.

W. Jung et al., "Elliptical magnetic arrays fabricated using zone-plate-array lithography," J. Vac. Sci. Technol. B., 22 (16), Nov./Dec. 2004, pp. 3335-3338.

R. Menon et al., "Scanning-spatial-phase alignment for zone-plate-array lithography," J. Vac. Sci. Technol. B., 22 (16), Nov./Dec. 2004, pp. 3382-3385.

R. Menon et al., "Photon-sieve lithography," Journal of the Optical Society of America A, vol. 22, No. 2, Feb. 2005, pp. 342-345.

R. Menon et al., "Maskless lithography," Materials Today (www.materialstoday.com), Feb. 2005, pp. 26-33.

R. Menon et al., "Zone-Plate-Array Lithography (ZPAL): Optical Maskless Lithography for Cost-Effective Patterning," to be published in Emerging Lithographic Technologies IX, Proc. SPIE, 2005.

W. Jung et al., "Magnetization reversal in single-layer and exchange-biased elliptical-ring arrays," Journal of Applied Physics, 97, 10K113, 2005.

Contrast Enhancement Materials from Shin Etsu Micro Si website (www.microsi.com/photolithography/cem.html) accessed Sep. 15, 2005.

D. Chao et al., "Immersion Zone-Plate-Array Lithography," to be published in Journal of Vacuum Sciences and Technology, Nov./Dec. 2005 (pre-print).

* cited by examiner

SYSTEM AND METHOD FOR CONTRAST ENHANCED ZONE PLATE ARRAY LITHOGRAPHY

The present application claims priority to U.S. Provisional Patent Application Ser. No. 60/653,766 filed on Feb. 17, 2005.

BACKGROUND

The present invention relates generally to lithography, and in particular, to zone plate array lithography.

In a zone plate array lithography system, an array of diffractive lenses such as Fresnel zone plates may be used to form an array of tightly focused spots on a photosensitive layer that is on top of a substrate. For example, U.S. Pat. No. 5,900,637, the disclosure of which is hereby incorporated by reference, discloses a mask-less lithography system and method that employs a multiplexed array of Fresnel zone plates. The light incident on each diffractive lens may be controlled, for example, by one pixel of a spatial light modulator. The spatial light modulator for use in such a system should provide a high refresh rate, be able to operate at short wavelengths such as under 200 nm, and be able to perform gray-scaling or intensity modulation in real time.

One commercially available spatial light modulator that may satisfy the above requirements is the grating light valve (GLV) spatial light modulator made by Silicon Light Machines of Sunnyvale Calif. The GLV consists of a linear array of pixels, and each pixel consists of six metallic ribbons that form a diffraction grating. Alternate ribbons may be moved by electrostatic actuation to provide either a reflective surface or a grating.

The lithographic resolution, however, of such a system may be limited by the contrast of the aerial image. The image contrast is dependent on the printed pattern. The optical performance may be quantified by calculating the aerial image contrast of a dense grating as a function of the half-pitch of the grating. The image contrast, K is defined as:

$$K = \frac{I_{max} - I_{min}}{I_{max} + I_{min}} \quad (1)$$

where $I_{max}$ and $I_{min}$ are defined as the maximum and minimum intensities of an illumination signal that may be employed to provide a desired pattern. For example, as shown in FIG. 1, a desired pattern 10 that includes alternating imaged regions (as shown at 12) and non-imaged regions may be created using an illumination signal 14. Note that the pitch p of the desired grating pattern 10 corresponds to the pitch p of the illumination signal 14.

The intensity profile of the illumination signal 14, however, results in an imaging pattern on a photoresist layer 16 when imaged by illumination source signals 18 (again having a pitch p). The photoresist layer 16 is supported by a wafer 20, and includes marked regions in the photoresist layer that have been exposed by the sources 18. After exposure, the photoresist layer is developed, and the marked regions are removed, leaving exposed portions 22 of the underlying wafer 20. Efforts to increase resolution (e.g., decrease the pitch p), however, may result in a degradation in image contrast, due at least in part to the intensity profile of the illumination signal 14.

In particular, the aerial images for gratings of different periods may be simulated assuming a zone plate array lithography system of numerical aperture (NA)=0.7 and λ=400 nm. The cross-section through each grating may then be averaged over several line-scans, and the image contrast may be calculated using Equation (1) above. The image contrast may be plotted as a function of $k_1$, where $k_1$ is a measure of the lithographic resolution (normalized to the wavelength and NA), and is given by:

$$k_1 = \frac{p}{2} \frac{NA}{\lambda} \quad (2)$$

where NA is the numerical aperture and λ is the exposing wavelength. For example, a system of the prior art may provide that $k_1$=0.32, which corresponds to an image contrast of about 18%. As the pitch p becomes smaller, the image contrast will be negatively affected, due in part, to the spatial extent of each illumination source 18.

Contrast enhanced lithography may be employed in an effort to improve image contrast. In particular, as shown in FIGS. 2A-2D, a contrast-enhancement material 24 that is spin coated on top of a photoresist layer 26 on a wafer 28. The contrast-enhancement material 24 may, for example, be a photo-bleachable polymer, whose absorption decreases (i.e., becomes more transparent) with increasing exposure dose. The intensity of transmitted light may be plotted as a function of time for an ideal contrast-enhanced system. Prior to exposure of the contrast-enhancement material 24, the material 24 is opaque, and almost no light passes through the material 24. After sufficient exposure by illumination beams 30, the material becomes transparent and light is transmitted in areas indicated at 32. Light is let though into the photoresist layer only where the exposure dose is high enough to bleach the contrast-enhancement material 24 completely. This increases the contrast of the image recorded in the photoresist. An antireflective coating between the photoresist and the wafer may also be employed.

As shown in FIG. 2B, illumination is able to reach defined regions 34 of the wafer 28 only in areas where the contrast-enhancement material 24 has become transparent (as shown at 32). The contrast-enhanced material 24 is then removed as shown in FIG. 2C using a suitable medium in (such as water) in which the contrast-enhancement material 24 will dissolve. The defined regions 34 are then removed through photoresist development, leaving openings 36 in the photoresist layer 26 through which portions of the wafer 28 may become exposed as shown in FIG. 2D.

By employing a contrast-enhancement material and by controlling the photo-bleaching rate of the contrast-enhancement material, as well as the clearing dose of the photoresist, one may enhance the contrast of the aerial image that is recorded in the photoresist. The contrast enhancement material behaves, in essence, as a contact mask, which increases the contrast of the image recorded in the photoresist. The contrast enhancement material is removed from the resist prior to development. If the contrast-enhancement material is incompatible with the photoresist, a barrier layer is needed between the contrast-enhancement material and the photoresist. This also incurs an additional step for removal of the barrier layer after exposure. There are several commercially available contrast-enhancement materials, some of which arc water-soluble.

Ideally, such contrast-enhancement materials would become bleached by the illumination signal 14 in an on/off step pattern that provides an instantaneous step at the edge of each illumination beam. Since the beams, however, provide an intensity profile as shown in FIG. 1B, the contrast-enhancement material bleaches in varying amounts with distance from the center of each illumination beam. This limits resolution. Moreover, repeated illumination near a non-imaged area may accumulate over time, and may eventually reach a threshold within the material for becoming transparent.

Contrast-enhancement may also be achieved by diluting the developer or by using thin photoresist layers, but such systems may also involve difficulties such as increased line-edge roughness, as well as difficulties with pattern transfer respectively.

There is a need therefore, for an imaging system that more efficiently and economically provides increased image contrast in mask-less lithography.

SUMMARY

In accordance with an embodiment, the invention provides a lithography system that includes an array of focusing elements for directing focused illumination toward a recording medium, and a reversible contrast-enhancement material disposed between the recording medium and the array of focusing elements.

In accordance with another embodiment, the invention provides a lithography system that includes a primary illumination source for imaging, an array of focusing elements for directing focused primary illumination toward a recording medium, and a reversible contrast-enhancement material that is disposed between the recording medium and the array of focusing elements.

In accordance with a further embodiment, the invention provides a method of forming a lithographic image on a photoresist material. The method includes the steps of illuminating at least a portion of a reversible contrast-enhancement material and an associated portion of a photoresist material, and ceasing illumination of the at least a portion of the reversible contrast-enhancement material and the associated portion of the photoresist material. The step of illuminating the reversible contrast-enhancement material causes the reversible contrast-enhancement material to change from a first state to a second state, and the step of ceasing illumination of the at least a portion of the reversible contrast-enhancement material causes the reversible contrast-enhancement material to change from the second state back to the first state.

BRIEF DESCRIPTION OF THE ILLUSTRATED EMBODIMENTS

The following description may be further understood with reference to the accompanying drawings in which.

The drawings are shown for illustrative purposes only and are not necessarily to scale.

DETAILED DESCRIPTION OF THE ILLUSTRATED EMBODIMENTS

The invention provides that a contrast-enhancement material may be used that is reversible in accordance with an embodiment of the invention. The exposure dose due to the background in each focused illumination beam may then be completely eliminated from the contrast-enhancement material and therefore the recorded image. Two spots, therefore, may be placed closer together than would otherwise have been possible using conventional contrast-enhancement material. Such imaging systems may be particularly suitable, for example, in dot-matrix printing systems in which each spot is printed independently of other spots. The smallest distance between exposed spots may, therefore, be much smaller than that dictated by the diffraction limit.

Figure 1A:
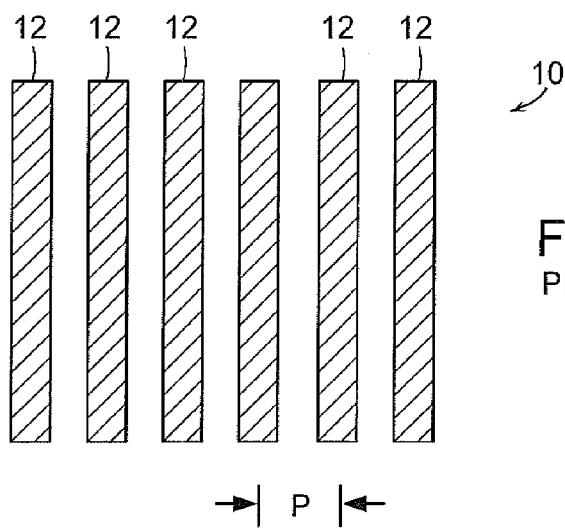
FIG. 1A shows an illustrative diagrammatic view of a desired image pattern.
Figure 1B:
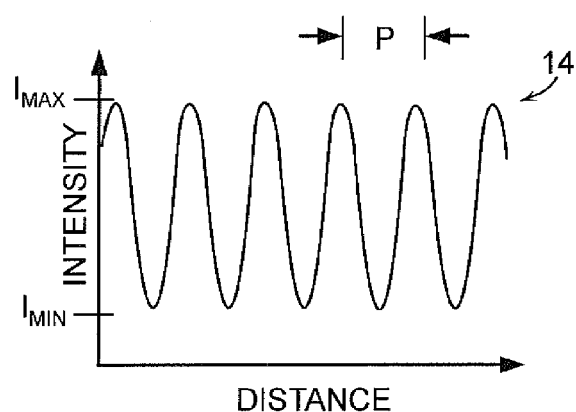
FIG. 1B shows an illustrative diagrammatic view of an illumination signal for forming an image pattern as shown in FIG. 1A.
Figure 1C:
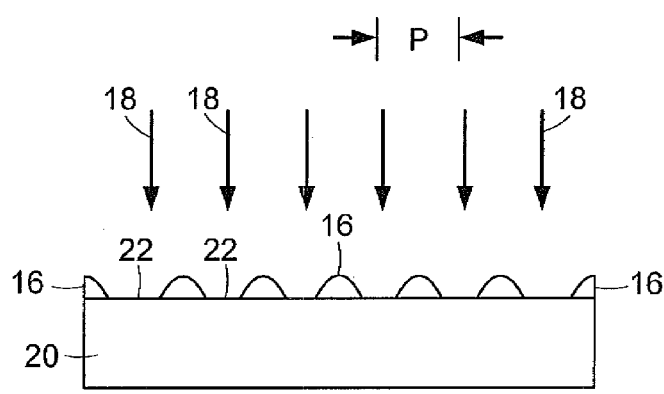
FIG. 1C shows an illustrative diagrammatic view of the formation of the desired image pattern shown in FIG. 1A using the illumination signal shown in FIG. 1B in accordance with the prior art.
Figure 2A:
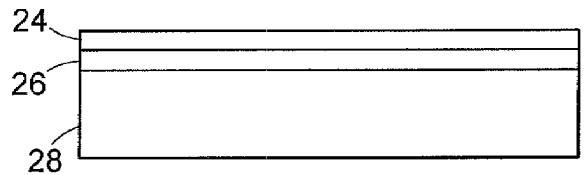
FIGS. 2A-2D show illustrative diagrammatic views of a process for forming the desired image pattern shown in FIG. 1A using contrast-enhanced lithography in accordance with another system of the prior art.
Figure 2B:
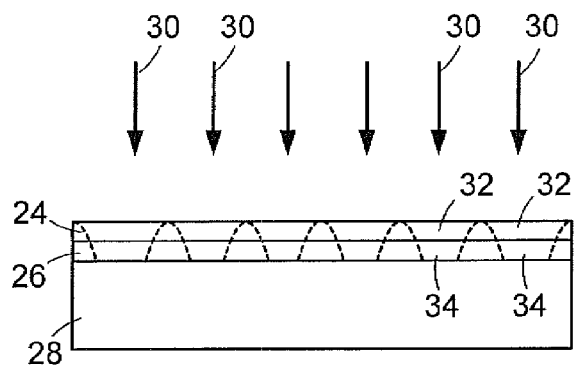
Figure 2C:
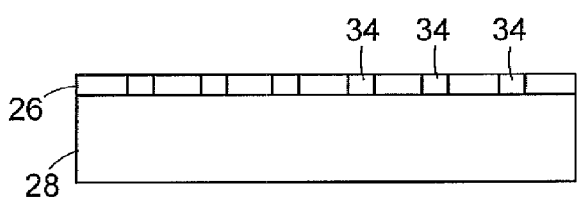
Figure 2D:
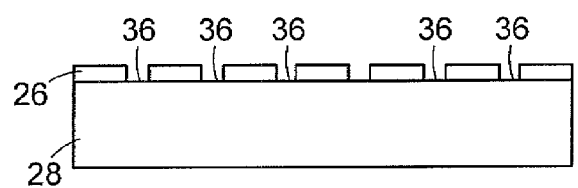
Figure 3A:
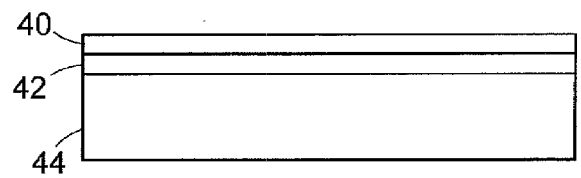
FIGS. 3A-3F show illustrative diagrammatic views of a process for forming the desired image pattern shown in FIG. 1A in accordance with another system of the prior art.
Figure 3B:
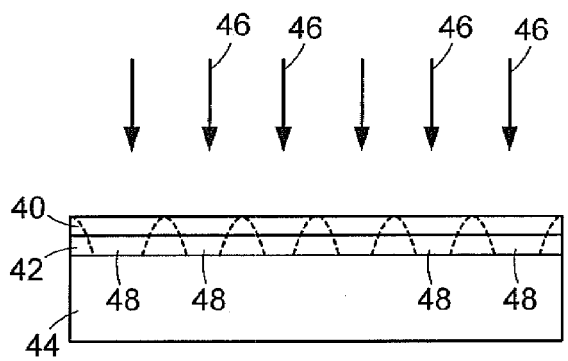
Figure 3C:
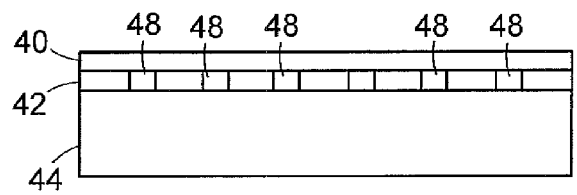

FIGS. 3A-3F show a lithography process in accordance with an embodiment of the invention. As shown in FIGS. 3A and 3B, a reversible contrast-enhancement material 40 on a photoresist material 42 on a wafer 44 is imaged with illumination beams 46, causing imaged regions 48 to be formed in the photoresist material 42. Once the illumination beams 46 cease, the reversible contrast-enhancement material 40 then reverts back to being opaque as shown in FIG. 3C.

Figure 3D:
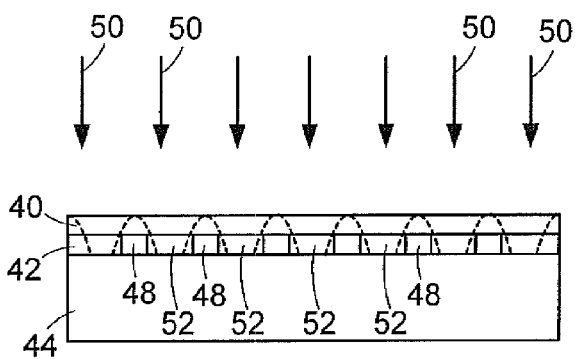
Figure 3E:
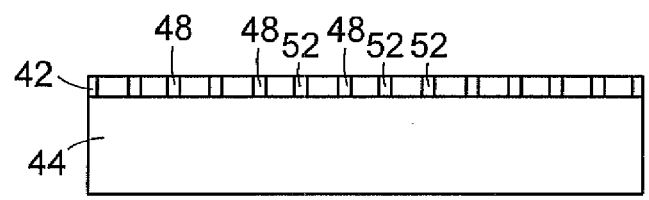
Figure 3F:
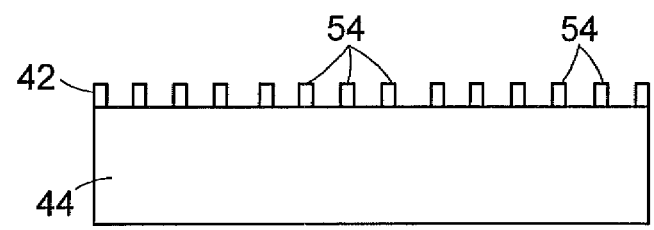

Then either the stage supporting the wafer is moved, or the illumination beams are moved. The composite is then imaged with illumination fields 50 at different locations with respect to the wafer than the image beams 46 as shown in FIG. 3D. This causes imaged regions 52 to be formed in the photoresist material 42. The imaged regions 52 may be very close to the imaged regions 48 in the photoresist material 42. When the reversible contrast-enhancement material is removed (as shown in FIG. 3E), the photoresist material 42 may be developed, leaving the desired pattern of unexposed portions 54 in the photoresist material 42 as shown in FIG. 3F.

Figure 4:
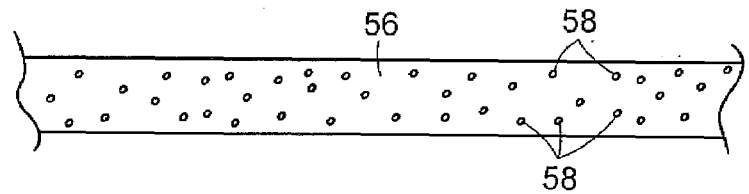
FIG. 4 shows an illustrative diagrammatic view of a reversible contrast enhancement material in accordance with another embodiment of the invention.

A photochromic organic compound, which includes reversible dyes under photochemical control, may be used for the reversible contrast-enhancement material. The recovery in this case occurs predominantly by thermal mechanism as is the case with spiropyrans, spirooxazines and chromenes. The thermally driven recovery may be aided by photochemical processes as well. In other compounds, the recovery may be predominantly photochemical (for, e.g., fulgides or arylethenes). In this case, exposure with a different wavelength (that does not affect the underlying photoresist), may be used to induce the recovery. Such recovery is also present in the saturable absorbers used in mode locked lasers, although the contrast may not be particularly high. The recovery is preferably spontaneous. The ideal material for the reversible contrast enhancement will have a high contrast between the transparent and the opaque states. It will also have very fast photobleaching and recovery kinetics. It should also be easily spin-coated into a thin film on top of the photoresist on a flat substrate. Finally, it should be easily removed after exposure without affecting the underlying photoresist. Other potential candidates for this material are: nanoparticles dispersed in polymer matrices, photochromic dye molecules (described above) dispersed in polymer matrices, thin films of Antimony, or semiconductor saturable absorbers used in mode-locked lasers, and carbon nanotubes. For example, FIG. 4 shows a substrate material 56 (e.g., a polymer matrix) that includes photochromic dye molecules 58.

Figure 5:
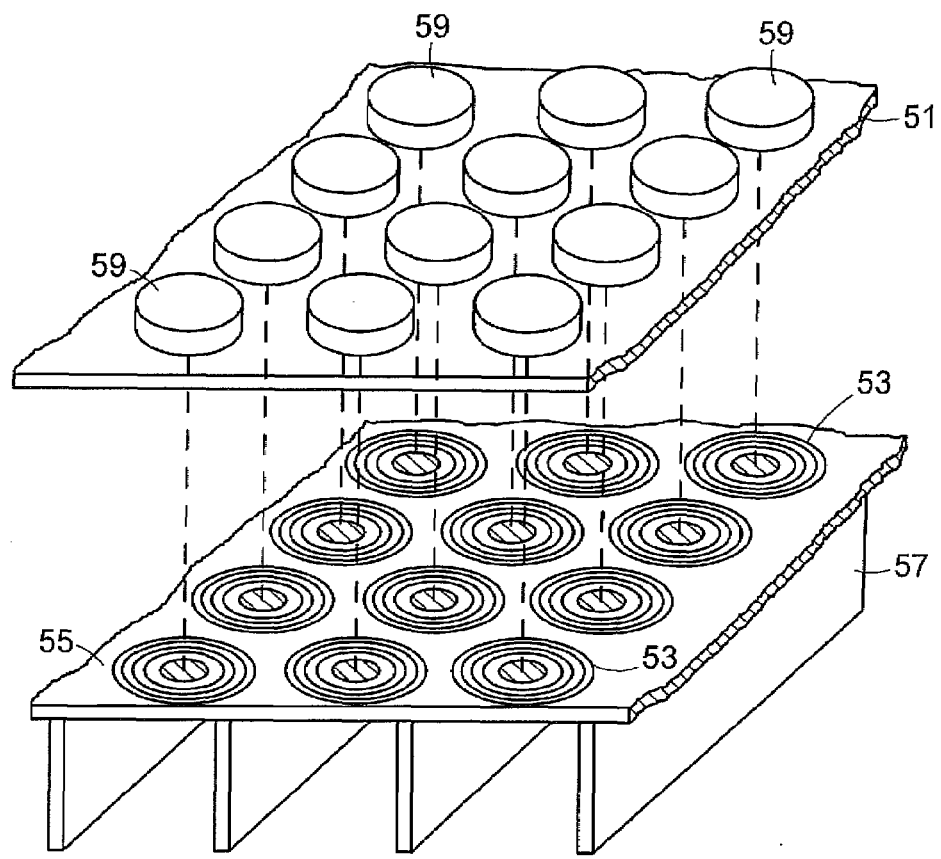
FIG. 5 shows an illustrative diagrammatic exploded view of an array of energy sources and an array of diffractive elements for use in a system in accordance with an embodiment of the invention.

A lithography systems in accordance with an embodiment of the invention may be used with arrays of a variety of focusing elements, such as Fresnel zone plates as disclosed in U.S. Pat. Nos. 5,900,637 and 6,894,292, the disclosures of which are hereby incorporated by reference. As shown in FIG. 5, an array of focusing elements 53 may be arranged on a silicon substrate 55, wherein each zone plate defines a unit cell. The array is supported on a thin membrane with vertical, anisotropically-etched silicon (Si) joists 57 for rigid mechanical support that divide rows of unit cells. Each zone plate is responsible for exposure only within its unit cell. In alternative embodiments of the invention, the joists may not be necessary, and the substrate need not be formed of silicon. The membrane is formed of a material that is transparent to the beam source. If the source is 4.5 nm x-ray, then the membrane may be formed of a thin carbonaceous material. If deep UV radiation is used, the membrane may be made of glass, and the zone plates may be made from phase zone plates, e.g., grooves cut into a glass plate or membrane.

An array of individually selectable sources 59 is also provided on a support substrate 51 such that each source is aligned with one of the focusing elements 53. The sources may be semiconductor lasers, diode lasers, light emitting diodes (LEDs), vertical cavity surface emitting lasers (VCSELs) or a variety of other sources such as x-ray sources or electron beam sources. These may be microfabricated in arrays, and may provide extremely high modulation frequencies (about 1 GHz), which translates to very high patterning speeds. In further embodiments, the each source 59 may include a micro-lens and/or phase-shift mask that provides a de-focused pattern (e.g., a ring phase shifted to π/2) at the corresponding focusing element 53 to narrow the point spread function at the image plane.

The focusing elements may be any of a variety of diffractive and/or refractive elements including those disclosed in U.S. patent application Ser. No. 10/624,316 filed Jul. 22, 2003, (the disclosure of which is hereby incorporated by reference) which claims priority to U.S. Provisional Application Ser. Nos. 60/397,705 and 60/404,514, including, for example, amplitude and/or phase Fresnel zone plates, blazed Fresnel zone plates, bessel zone plates, photon sieves (e.g., amplitude photon sieves, phase photon sieves, or alternating phase photon sieves), and the diffractive focusing elements may be apodized. These may be microfabricated in large arrays as well, and may be designed to compensate for wavefront characteristics in the radiation output from the source array to achieve, for example, the smallest possible focal spot.

Figure 6:
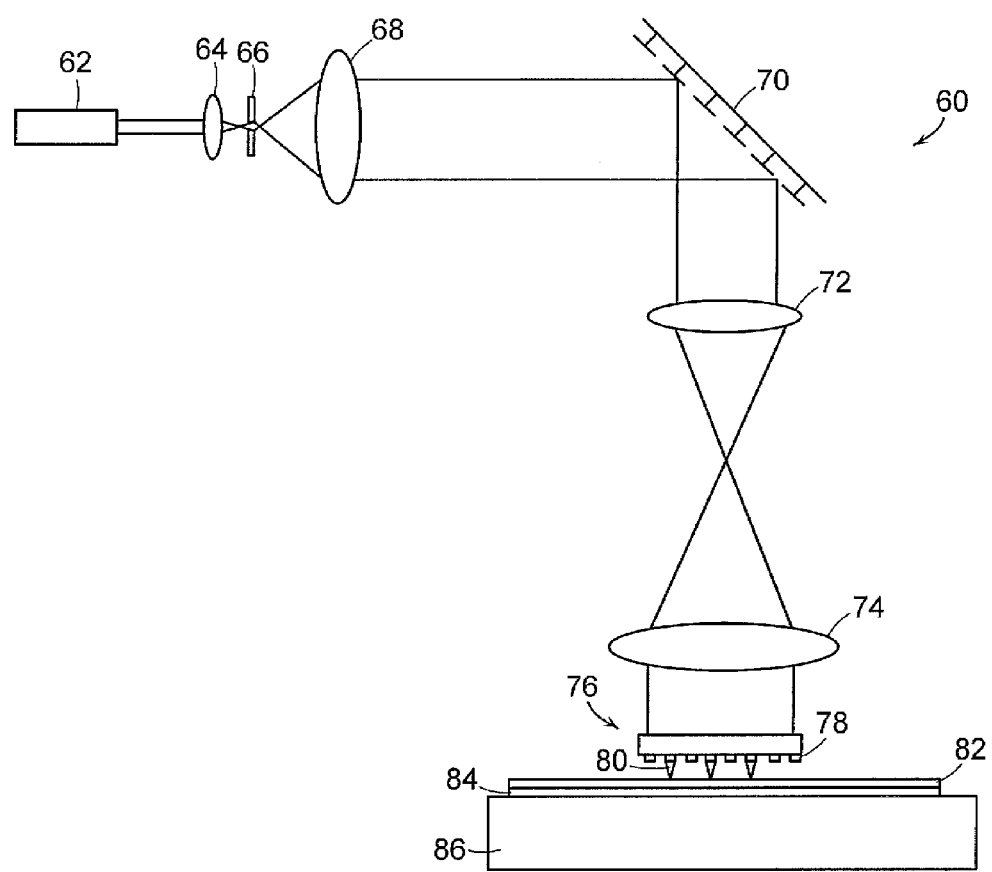
FIG. 6 shows an illustrative diagrammatic view of a lithography system in accordance with an embodiment of the invention.

FIG. 6 shows an example of a lithography system 60 in accordance with an embodiment of the invention. The system 60 includes a laser source 62, an imaging lens 64, a spatial filter 66, a collimating lens 68, a spatial light modulator 70, telescoping lenses 72, 74, a diffractive element array 76 including a plurality of diffractive elements 78, and a photoresist material 84 that is covered by a reversible contrast-enhancement material 82 and is supported by a stage 86. The reversible contrast-enhancement material 82 is used as a top coat on the photoresist material 84. The diffractive elements may be zone plates (such as Fresnel zone plates) or photon sieves.

Illumination from the laser source 62 is directed toward the spatial light modulator 70, and light is selectively reflected from the spatial light modulator 70 onto specific zone plates 78 of the zone plate array 76 for forming the desired imaging pattern. The illuminated zone plates 78 direct focused illumination onto desired locations of the photoresist material 86 as shown at 80. The scanning stage may be moved to provide the desired image pattern over the entire photoresist material 84. In this example, the exposing wavelength bleaches the reversible contrast-enhancement material. When the exposing illumination is turned off (either by the laser turning off or the spatial light modulator moving the illumination beam away from the zone plates 78), the reversible contrast-enhancement material relaxes spontaneously. The timing of the on and off states of the exposing light is controlled to achieve the appropriate exposure of the photoresist.

Figure 7:
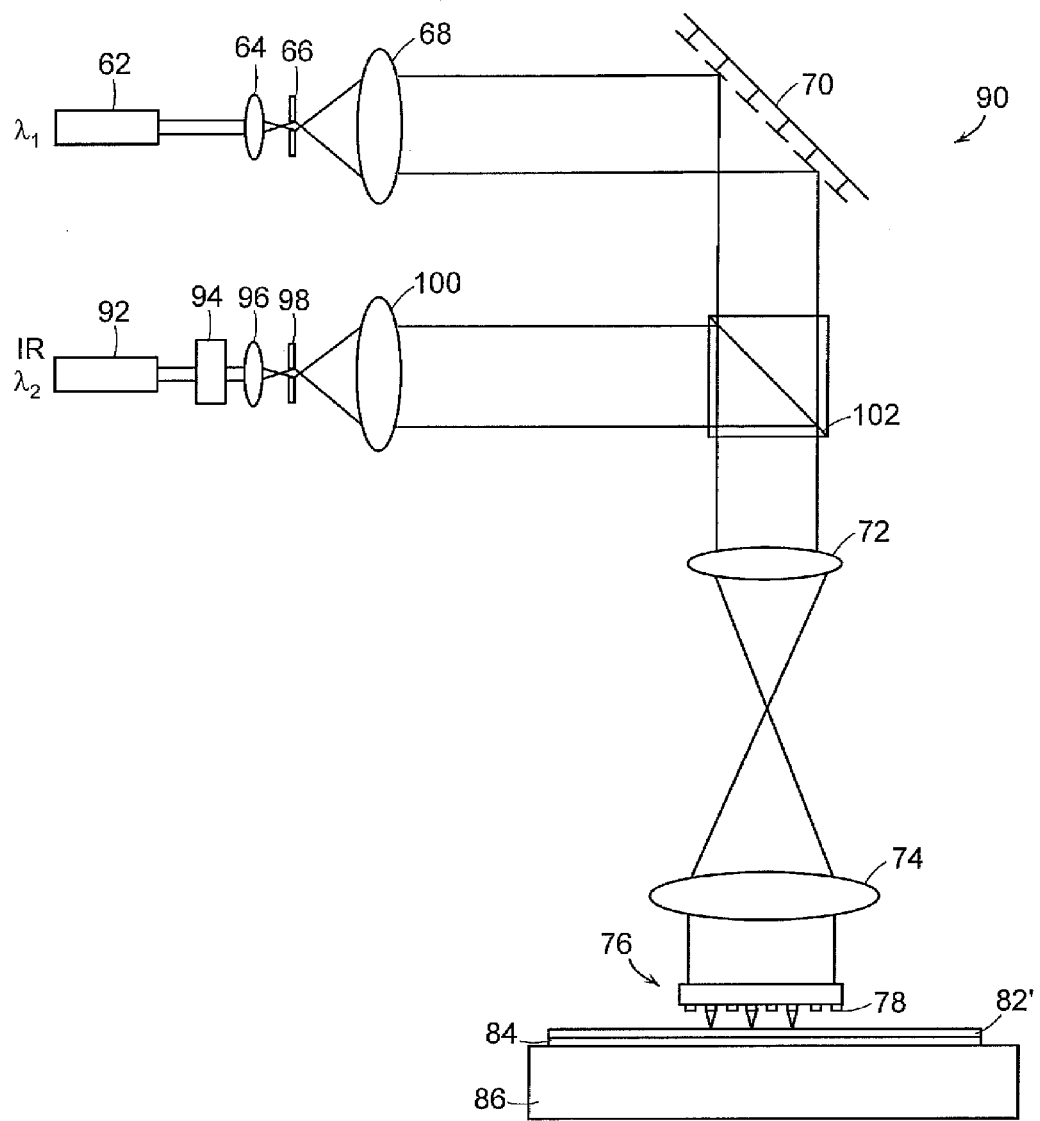
FIG. 7 shows an illustrative diagrammatic view of a lithography system in accordance with another embodiment of the invention.

In accordance with another embodiment, a system 90 (shown in FIG. 7) may include a laser source 62, an imaging lens 64, a spatial filter 66, a collimating lens 68, a spatial light modulator 70, telescoping lenses 72, 74, a zone plate array 76 including a plurality of zone plates 78, and a photoresist material 84 that is covered by a reversible contrast-enhancement material 82' and is supported by a stage 86 similar to those shown in FIG. 6. As also shown in FIG. 7, however, the relaxation of the reversible contrast-enhancement material 82' of the system 90 may be assisted by exposure with infrared (IR) illumination (it for example, the relaxation is thermal), or by exposure with illumination having a second wavelength ($\lambda_2$) that is different than the wavelength ($\lambda_1$) of the laser source 62 (it for example, the relaxation is photo-initiated).

The exposure of the IR or $\lambda_2$ illumination may be provided by a source 92, shutter or acousto-optic modulator (ACM) 94, an imaging lens 96, a spatial filter 98, a collimating lens 100 and a beam splitter/combiner 102. This system 90 provides that the exposure of the IR or $\lambda_2$ illumination for relaxing the reversible contrast-enhancement material 82' floods the reversible contrast enhancement material 82' after each time that the source 62 and modulator 70 are used for imaging a spot on the photoresist material 84. The ACM 94 may be used to switch the exposure for relaxation in rhythm with the exposing wavelength. The relaxation exposure is turned on when the exposing wavelength is turned off.

Figure 8:
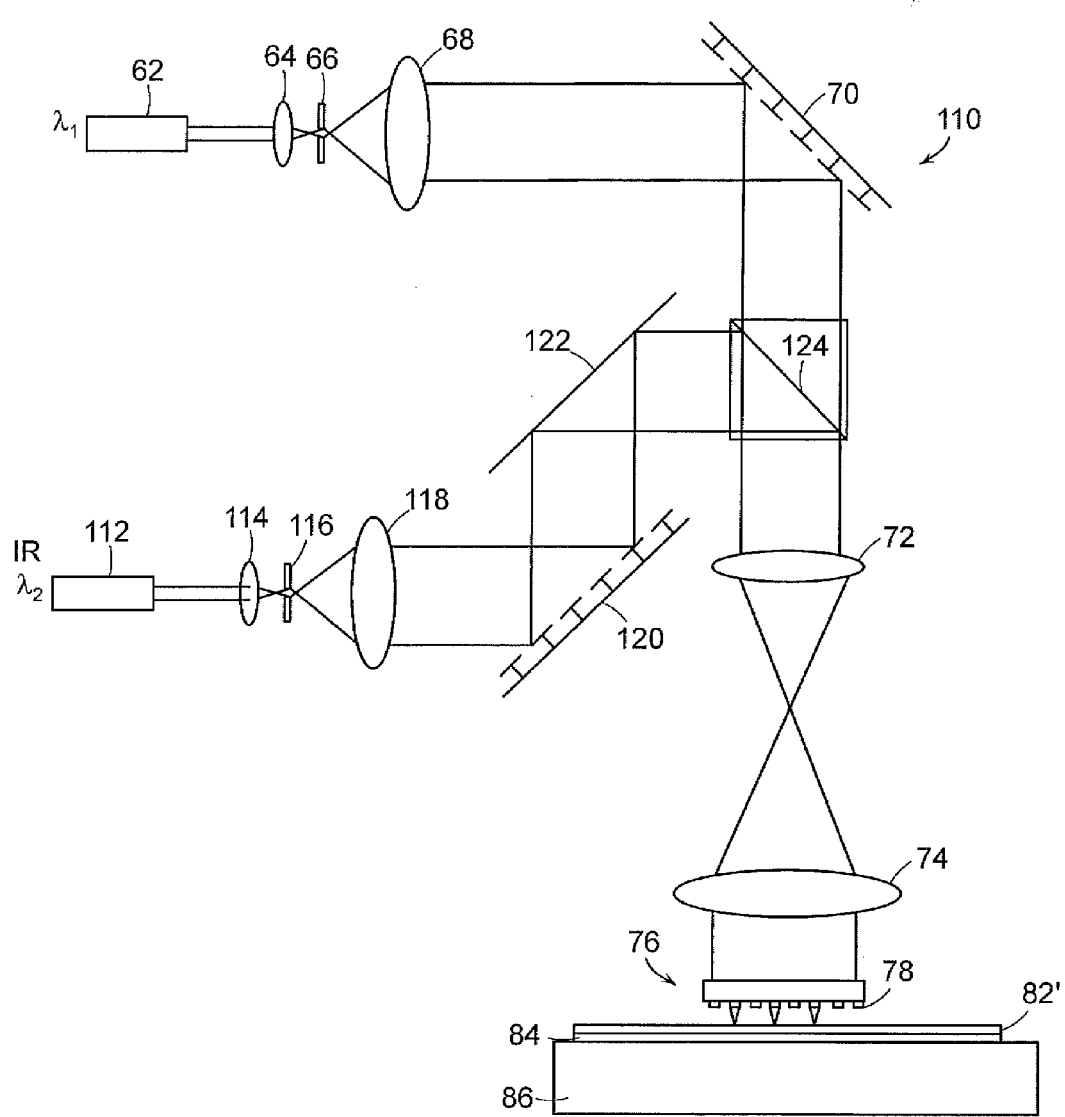
FIG. 8 shows an illustrative diagrammatic view of a lithography system in accordance with a further embodiment of the invention.

In accordance with a further embodiment of the invention, a system 110 may provide for relaxation of selective regions of the reversible contrast-enhancement material as shown in FIG. 8. In particular, the system 110 may include a laser source 62, an imaging lens 64, a spatial filter 66, a collimating lens 68, a spatial light modulator 70, telescoping lenses 72, 74, a zone plate array 76 including a plurality of zone plates 78, and a photoresist material 84 that is covered by a reversible contrast-enhancement material 82' and is supported by a stage 86 similar to those shown in FIG. 6. As also shown in FIG. 8, however, the relaxation of the reversible contrast-enhancement material 82' of the system 110 may be assisted by exposure with IR illumination, or by exposure with illumination having a second wavelength ($\lambda_2$) that is different than the wavelength ($\lambda_1$) of the laser source 62. The exposure of the IR or $\lambda_2$ illumination may be provided by a source 112, an imaging lens 114, a spatial filter 116, a collimating lens 118, a second spatial light modulator 120, a mirror 122, and a beam splitter/combiner 124. This system 110 provides that the exposure of the IR or $\lambda_2$ illumination for relaxing the reversible contrast-enhancement material 82' is selectively directed to desired locations of the reversible contrast enhancement material 82' immediately after imaging of the associated locations on the photoresist material 84. The focusing of the IR or $\lambda_2$ illumination may be achieved by using the same zone plates 78 of the zone plate array 76, either by providing that the zone plates 78 are sufficiently focused at the desired locations to achieve relaxation of the reversible contrast-enhancement material, or by providing that the zone plates 78 are designed to focus illumination of wavelengths $\lambda_1$ and either IR or $\lambda_2$ at the same focal distance.

In accordance with yet another embodiment, the invention may provide that a shaped-beam may be used to create a null in the reversible contrast-enhanced material at the desired exposed location. For example and as shown in FIGS. 9A-9E, a photoresist material 130 may be top coated with a reversible contrast-enhancement material 132 (and may also include an anti-reflective coating between the photoresist material and the wafer 134, as well as a barrier layer if desired). The reversible contrast-enhancement material in this example, however, is initially transparent to exposing illumination having a wavelength $\lambda_{exp}$. The reversible contrast-enhancement material becomes opaque when exposed to illumination having a transforming wavelength $\lambda_{tr}$.

Figure 9A:
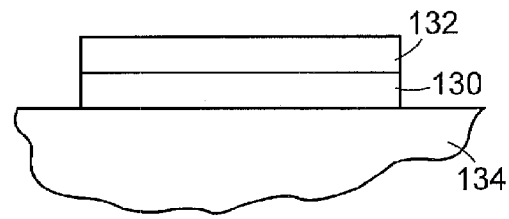
FIGS. 9A-9E show illustrative diagrammatic views of a system in accordance with a further embodiment of the invention that may be employed for forming marks having a scale smaller than the resolution of the imaging system.
Figure 9B:
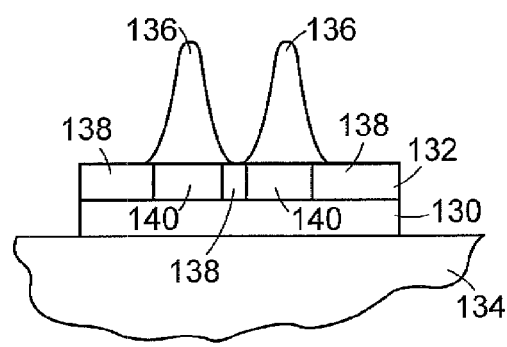
Figure 9C:
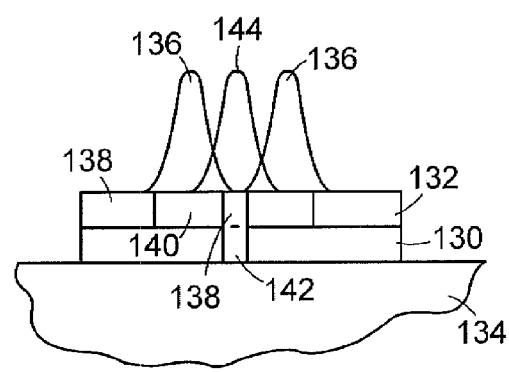

In particular, as shown in FIG. 9B, an annular ring spot is first created using the illumination $\lambda_{tr}$ as diagrammatically shown at 136. The illumination 136 causes the reversible contrast-enhancement material 132 to develop opaque regions 140 while leaving transparent regions 138 as shown in FIG. 9B. The transparent region 138 that is in the center of the ring spot is then used as a mask for illuminating the photoresist material 130 at that location 142 using exposure illumination 144 ($\lambda_{exp}$) as shown in FIG. 9C. The imaged region 142 may be smaller than the smallest imaging element size possible using conventional imaging, and is made possible by using the reversible contrast-enhanced material in accordance with an embodiment of the invention.

Figure 9D:
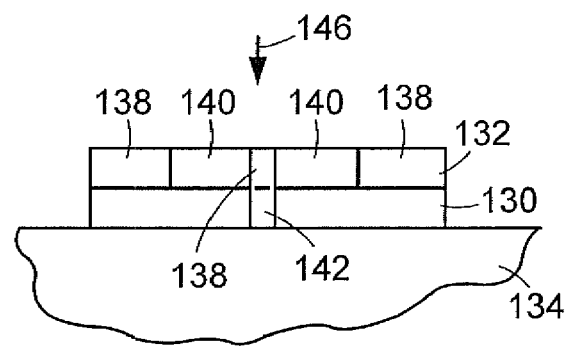
Figure 9E:
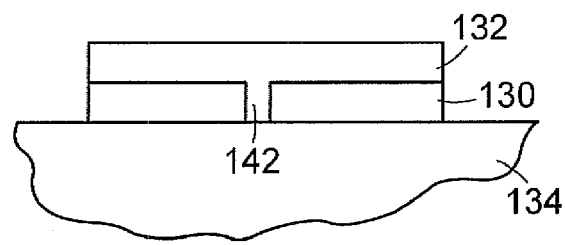

The system may then either wait until the reversible contrast-enhancement material relaxes and becomes transparent again, or may apply a relaxation illumination 146 (e.g., IR or another wavelength illumination $\lambda_{rel}$) to cause the reversible contrast-enhancement material to relax and become transparent again as shown in FIGS. 9D and 9E.

Figure 10:
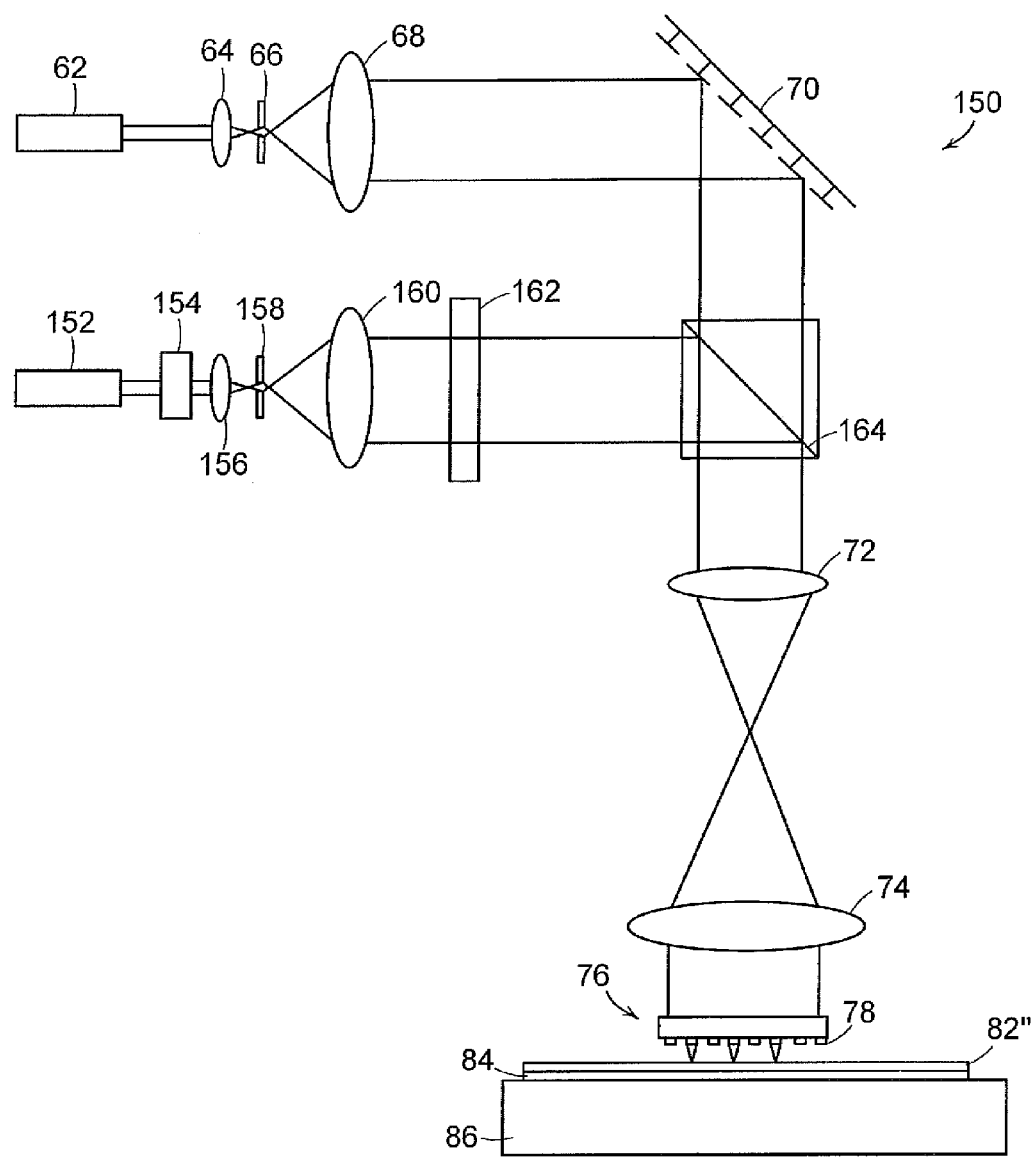
FIG. 10 shows an illustrative diagrammatic view of a lithography system in accordance with a further embodiment of the invention.

As shown in FIG. 10, a system 150 for providing the annular ring spot used in FIGS. 9A-9E may include the laser source 62, the imaging lens 64, the spatial filter 66, the collimating lens 68, the spatial light modulator 70, telescoping lenses 72, 74, the diffractive element array 76 including a plurality of diffractive elements 78, and the photoresist material 84 that is covered by the reversible contrast-enhancement material 82" and is supported by the stage 86 as discussed above with reference to FIG. 6. The system also includes a source 152 (of $\lambda_{tr}$ illumination), a shutter or acousto-optic modulator (AOM) 154, an imaging lens 156, a spatial filter 158, a collimating lens 160, a phase plate 162, and a beam splitter/combiner 164. The phase plate 162 provides a phase shift in the $\lambda_{tr}$ illumination (of, for example $\lambda_{tr}/2$) to provide the annular ring spot illumination 136 shown in FIGS. 9B and 9G.

Those skilled in the art will appreciate that numerous modifications and variations may be made to the above disclosed embodiments without departing from the spirit and scope of the invention.

What is claimed is:

1. A lithography system comprising:
    an array of focusing elements for directing focused illumination toward a recording medium;
    a reversible contrast-enhancement material being disposed between said recording medium and said array of focusing elements; and
    a primary illumination source for providing illumination having a first wavelength for imaging in said recording medium, and a secondary illumination source that selectively provides secondary illumination toward said reversible contrast-enhancement material for facilitating relaxation of said reversible contrast-enhancement material, wherein the relaxation of the reversible contrast-enhancement material is assisted by illumination at a second wavelength that is different than the first wavelength, and wherein said first wavelength and second wavelength simultaneously illuminate the reversible contrast-enhancement material, said first wavelength illuminating a limited portion of the reversible contrast-enhancement material, said second wavelength illuminating an overlapping region of said reversible contrast-enhancement material and having within said overlapping region a smaller region of minimum intensity, the second wavelength converts the reversible contrast-enhancement material from a first state that is substantially transparent to the first wavelength, to a second state that is substantially opaque to the first wavelength.

2. The lithography system as claimed in claim 1, wherein said reversible contrast-enhancement material includes a photochromic compound.

3. The lithography system as claimed in claim 1, wherein said reversible contrast-enhancement material includes any one of photochromic dye molecules in a polymer matrix, a thin film of antimony, semiconductor saturable absorbers or carbon nanotubes.

4. The lithography system as claimed in claim 1, wherein said system further includes a spatial light modulator for selectively providing said primary and/or secondary illumination to desired portions of said reversible contrast-enhancement material.

5. The lithography system as claimed in claim 1, wherein said reversible contrast-enhancement material becomes transparent when illuminated with said primary illumination.

6. The lithography system as claimed in claim 1, wherein said system further includes an annular ring illumination means for providing an annular illumination area in the general shape of a ring on the reversible contrast-enhancement material.

7. The lithography system as claimed in claim 6, wherein said annular ring illumination means includes a phase shift unit.

8. A lithography system comprising a primary illumination source for imaging, an array of focusing elements for directing focused primary illumination having a first wavelength toward a recording medium, through a reversible contrast enhancement material, a secondary illumination source that selectively provides secondary illumination toward said reversible contrast-enhancement material for facilitating relaxation of said reversible contrast-enhancement material during and following imaging, a reversible contrast-enhancement material being disposed between said recording medium and said array of focusing elements, wherein the relaxation of the reversible contrast-enhancement material is assisted by exposure with an illumination having a second wavelength that is different than the first wavelength, and wherein said first wavelength and second wavelength selectively simultaneously illuminate the reversible contrast-enhancement material, said first wavelength illuminating a limited portion of the reversible contrast-enhancement material, said second wavelength illuminating an overlapping region of said reversible contrast-enhancement material and having within said overlapping region a smaller region of minimum intensity, the second wavelength converts the reversible contrast-enhancement material from a first state that is substantially transparent to the first wavelength, to a second state that is substantially opaque to the first wavelength.

9. The lithography system as claimed in claim 8, wherein said reversible contrast-enhancement material includes a photochromic compound.

10. The lithography system as claimed in claim 8, wherein said system further includes a spatial light modulator for selectively providing said primary and/or secondary illumination to desired portions of said reversible contrast-enhancement material.

11. The lithography system as claimed in claim 8, wherein said reversible contrast-enhancement material becomes transparent when illuminated with said primary illumination.

12. The lithography system as claimed in claim 8, wherein said reversible contrast-enhancement material becomes opaque when illuminated with said secondary illumination.

13. The lithography system as claimed in claim 8, wherein said system further includes an annular ring illumination means for providing an annular illumination area in the general shape of a ring on the reversible contrast-enhancement material and wherein said annular ring illumination means includes a phase shift unit.

14. The lithography system as claimed in claim 8, wherein said focusing elements include any of refractive lenses, refractive microlenses, diffractive microlenses, phase zone plates, amplitude zone plates, photon sieves, blazed zone plates and Bessel zone plates.

* * * * *

UNITED STATES PATENT AND TRADEMARK OFFICE
CERTIFICATE OF CORRECTION

| | | |
|---|---|---|
| PATENT NO. | : 7,667,819 B2 | Page 1 of 1 |
| APPLICATION NO. | : 11/154352 | |
| DATED | : February 23, 2010 | |
| INVENTOR(S) | : Menon et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1083 days.

Signed and Sealed this

Twenty-eighth Day of December, 2010

David J. Kappos
*Director of the United States Patent and Trademark Office*